(12) United States Patent
Kreupl

(10) Patent No.: US 6,809,379 B2
(45) Date of Patent: Oct. 26, 2004

(54) FIELD EFFECT TRANSISTOR AND METHOD FOR PRODUCING A FIELD EFFECT TRANSISTOR

(75) Inventor: Franz Kreupl, Munich (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/258,354

(22) PCT Filed: May 14, 2001

(86) PCT No.: PCT/DE01/01798

§ 371 (c)(1), (2), (4) Date: Feb. 24, 2003

(87) PCT Pub. No.: WO01/88996

PCT Pub. Date: Nov. 22, 2001

(65) Prior Publication Data

US 2003/0155591 A1 Aug. 21, 2003

(30) Foreign Application Priority Data

May 16, 2000 (DE) ........................... 100 23 871

(51) Int. Cl.[7] .............................................. H01L 27/01
(52) U.S. Cl. ...................... 257/347; 257/352; 257/368; 257/412; 257/217; 257/902
(58) Field of Search ................................ 257/347, 352, 257/368, 412, 217, 902

(56) References Cited

U.S. PATENT DOCUMENTS 5,428,234 A * 6/1995 Sumi ........................ 257/287

6,291,852 B1 * 9/2001 Yano et al. ................. 257/314

FOREIGN PATENT DOCUMENTS

EP       0 865 078 A1     9/1998

OTHER PUBLICATIONS

R. Müller, Bauelemente der Halbleiter–Elektronik, Springer Verlag, first edition, ISBN 3–540–06224–6, p. 130–157, 1973.
Z. Ovadyahu and M. Poltak, Disorder and Magnetic Field Dependence of Slow Electronic Relaxation, Physical Review Letters, vol. 79, No. 3, Jul. 1997, pp. 459–462.
Shirakashi J–I et al., Fabrication and characterization of NB/NB Oxides–Based single electron transistors (Sets), Extended Abstracts of the International Conference on Solid State Devices and Materials, Japan Society of Applied Physics. Tokyo, Japan, vol. Conf. 1996, pp. 440–442.
Martinez–Arizala G., et al., Coulomb–Glass–Like Behaviour of Ultrathing Films of Metals, Physical Review B, vol. 57, No. 2, Jan. 1, 1998, pp. 670–672, XP002177588.
Snow, E.S., et al., A Metal/Oxide Tunneling Transistor, Applied Physics Letters, American Institute of Physics. New York, US, vol. 72, No. 23, Jun. 8, 1998, pp. 3071–3073, XP000766329.

* cited by examiner

Primary Examiner—Minhloan Tran
Assistant Examiner—Remmon R. Fordé
(74) Attorney, Agent, or Firm—Altera Law Group, LLC; Jeffrey R. Stone

(57) ABSTRACT

The invention relates to a field effect transistor with a drain region, a source region, a channel region and a gate region. The gate region is provided with a metal layer.

11 Claims, 1 Drawing Sheet

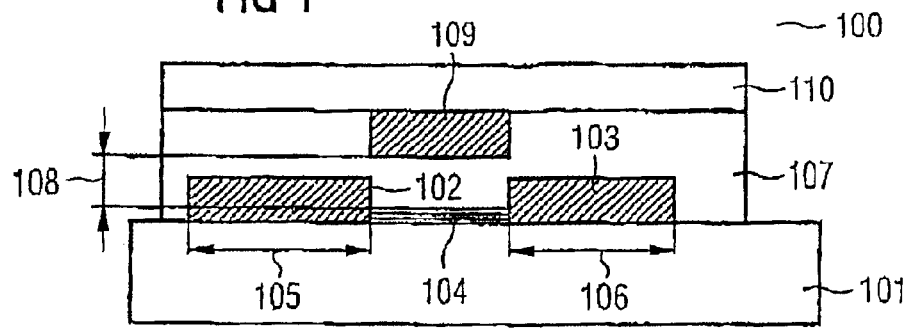
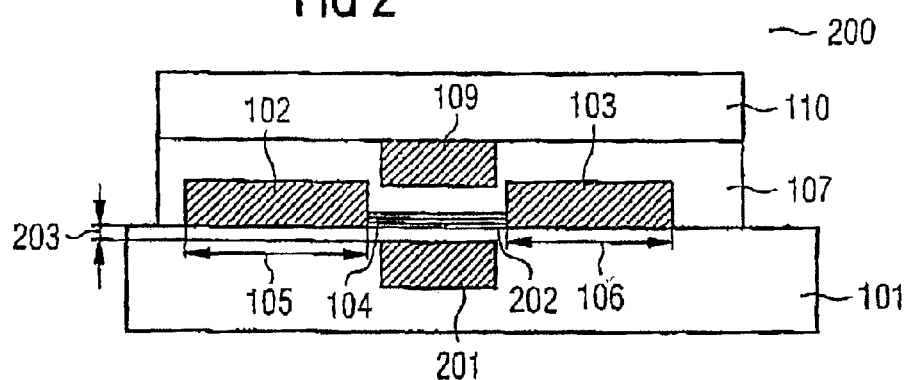
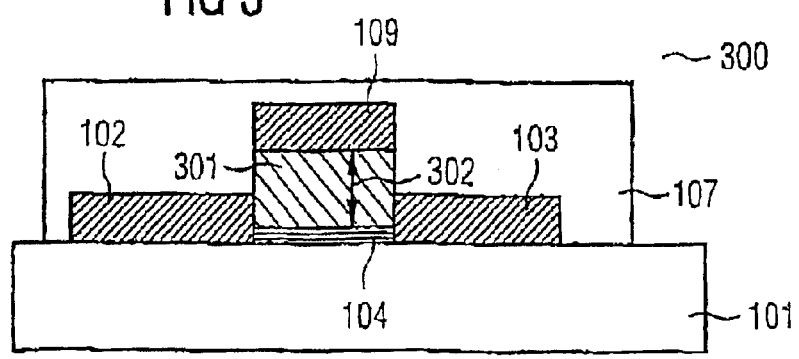

FIELD EFFECT TRANSISTOR AND METHOD FOR PRODUCING A FIELD EFFECT TRANSISTOR

BACKGROUND OF THE INVENTION

1. Field of the Invention

The invention relates to a field-effect transistor and to a process for fabricating a field-effect transistor.

2. Description of the Related Prior Art

A field-effect transistor of this type and a process for its fabrication are known from [1].

Furthermore, it is known, in the case of the conventional field-effect transistor described in [1], that the length of the space charge region and, by association, the length of the channel region d are indirectly proportional to the root of the doping of the semiconductor used as substrate in the field-effect transistor.

Therefore, the following relationship applies to the field-effect transistors which are known from [1]:

$$d \propto \sqrt{\frac{1}{N}} \quad (1)$$

It is clear from this relationship between the length of the channel region and the doping of the substrate that the scalability of a semiconductor component, in particular a semiconductor field-effect transistor, is restricted by the fact that the doping of the semiconductor used can only be scaled to a limited extent.

Furthermore, [2] describes what is known as a metal tunnel transistor, in which a barrier layer, through which electric charge carriers are to tunnel and which according to [2] consists of niobium oxide, is provided between the source region and the drain region of the field-effect transistor.

It is described in [3], [4], that what is known as a field effect can be observed in the metal layer in the case of a very thin metal layer with a thickness of a few nanometers, in particular a thickness of 5.5 nm.

BRIEF SUMMARY OF THE INVENTION

The invention is based on the problem of describing a field-effect transistor and a process for fabricating a field-effect transistor with a scalability which is improved compared to that of the known field-effect transistors.

The problem is solved by the field-effect transistor and the process for fabricating a field-effect transistor having the features described in the independent patent claims.

A field-effect transistor has an electrically nonconductive substrate, a drain region and a source region.

Both the drain region and the source region may contain a metal electrode.

Between the drain region and the source region there is a channel region, the channel region having a metal layer, i.e. A metal layer obviously forms the channel region which is required in a field-effect transistor in order to transfer electrical charge carriers from the source region to the drain region. Furthermore, there is a gate region, by means of which the channel region can be controlled.

A field-effect transistor of this type can be produced using the following process.

A drain region and a source region are formed on or in a substrate. A channel layer, which forms a channel region, is applied to the substrate between the drain region and the source region. A separating layer is applied to the metal layer and between the drain region and the source region. A gate region is formed on the separating layer, the gate region being electrically separated from the drain region, the source region and the channel region by the separating layer, in such a manner that the channel region can be controlled by means of the gate region.

Evidently, the invention can be regarded as consisting in the fact that the channel region, which in conventional field-effect transistors is formed by a semiconductor material and can be controlled by means of a gate region, according to the invention is formed by a metal layer which, on account of a field-effect which occurs with a thin metal layer, can be controlled by means of the gate region of a field-effect transistor.

A second gate region may be provided in the field-effect transistor, so that what is known as a dual gate arrangement is formed in the field-effect transistor. The second gate region can also be used to control the channel region, as in a conventional field-effect transistor. The first gate region and the second gate region may be electrically coupled to one another.

The metal layer may have one or more layers of metal atoms.

Particularly in view of the very high scalability of the metal layer and the fact that the width of the channel region is independent of the doping of the semiconductor material, since metal is now used to produce the channel in the field-effect transistor, the scalability of the field-effect transistor according to the invention is now improved considerably.

A further advantage of the invention is to be seen in particular in the high electrical conductivity of the metal layer which forms the channel region.

In this way, the power loss which is generated when the field-effect transistor switches from a first state into a second state is reduced. On account of the high conductivity of the metal-layer, the speed of the switching operation of the field-effect transistor is also increased considerably compared to conventional field-effect transistors.

The metal layer may contain at least one of the following metals:

platinum, gold, silver, titanium, tantalum, palladium, bismuth, indium, chromium, vanadium, manganese, iron, cobalt, nickel, yttrium, zirconium, niobium, molybdenum, technetium, hafnium, tungsten, or an alloy of at least two of the abovementioned metals.

The separating layer may be an electrically insulating separating layer and/or a layer with a high dielectric constant and/or a ferroelectric layer. In particular, the separating layer may contain SBT, silicon dioxide and/or BST. Furthermore, it is provided, according to a configuration of the invention, for the drain region and/or the source region and/or the gate region to include metal, for example a metal electrode.

The metal used for the metal electrode or the metal electrodes may be the same metals as for the metal layer, i.e. The metal electrode or the metal electrodes may contain:

platinum, gold, silver, titanium, tantalum, palladium, bismuth, indium or an alloy of at least two of the abovementioned metals.

However, it is also possible to use other metals as metal electrodes.

On account of the high conductivity of the corresponding connections, i.e. Electrodes, of the field-effect transistor, the overall conductivity of the field-effect transistor is increased further according to this configuration of the invention, thus increasing the speed when the field-effect transistor switches from a conductive state to a blocking state.

On account of the high switching speed, the field-effect transistor is therefore particularly suitable for high-frequency applications.

The drain region and the source region may be formed on the substrate in a known way, for example by means of predeterminable doping of charge carriers, electrons or holes.

The metal layer may be applied by means of a suitable chemical vapour disposition process (CVD process), a physical vapour deposition process, a sputtering process or an atomic layer deposition process.

The above-described configurations of the invention with regard to the field-effect transistor also apply to the process for fabricating the field-effect transistor.

BRIEF DESCRIPTION OF THE DRAWINGS

Exemplary embodiments of the invention are illustrated in the figures and are described in more detail below. In the drawing:

FIG. 1 shows a cross section through a field-effect transistor according to a first exemplary embodiment of the invention;

FIG. 2 shows a cross section through a field-effect transistor according to a second exemplary embodiment of the invention;

FIG. 3 shows a cross section through a field-effect transistor according to a third exemplary embodiment of the invention.

DETAILED DESCRIPTION OF THE INVENTION

FIG. 1 shows a field-effect transistor 100 according to a first exemplary embodiment of the invention.

The field-effect transistor 100 has a substrate 101 comprising electrically nonconductive material, i.e. An electrically insulating material, specifically, according to the first exemplary embodiment, comprising silicon dioxide $SiO_2$ or aluminium oxide $Al_2O_3$.

A first metal electrode 102 and a second metal electrode 103 are applied to the substrate 101, at a distance of 1 nm to 1000 nm from one another, by means of a CVD process, a sputtering process or a physical vapour deposition process.

The first metal electrode 102 and the second metal electrode 103 may be fabricated from platinum or from titanium. Alternatively, it is possible to use any desired metal alloys or metals to form the first metal electrode 102 or the second metal electrode 103.

The first metal electrode 102serves as source region of the field-effect transistor 100, and the second metal electrode 103 serves as drain region of the field-effect transistor 100.

A monoatomic or multiatomic metal layer 104 comprising platinum is deposited between the first metal electrode 102 and the second metal electrode 103 by means of a suitable CVD process.

The metal layer 104 is electrically coupled to the first metal electrode 102 and to the second metal electrode 103 and evidently forms a channel region inside the field-effect transistor 100.

The first metal electrode 102 and the second metal electrode 103 each have a width b, in each case symbolically indicated in FIG. 1 by a double arrow 105, 106, of from 1 nm to 100 nm. In this context, it should be pointed out that the widths of the metal electrodes 102, 103 do not have to be identical.

The channel region, i.e. The metal layer 104, has an area of $1 \times 1$ $nm^2$ to $1000 \times 1000$ $nm^2$.

In a further process step, an electrically insulating separating layer 107 of silicon dioxide or silicon nitride $Si_3N_4$ is applied to the metal layer 104 by means of a CVD process, a sputtering process or a physical vapour deposition process.

A gate electrode 109, which forms a gate region, is introduced into or applied to the separating layer 107 at a distance p from the surface of the channel region, i.e. From the surface of the metal layer 104, as symbolically indicated in FIG. 1 by a further double arrow 108, in a range from 1 nm to 50 nm.

The gate electrode 109 may also be fabricated from the abovementioned metals or metal alloys from which the first metal electrode 102 or the second metal electrode 103 may be formed.

Furthermore, in a final step aimed at protecting the field-effect transistor 100, a further insulating layer 110, which includes, for example, silicon dioxide or silicon nitride, is applied above the separating layer 107.

FIG. 2 shows a field-effect transistor 200 according to a second exemplary embodiment of the invention.

Elements of the field-effect transistor 200 according to the second exemplary embodiment which are identical to the elements of the field-effect transistor 100 according to the first exemplary embodiment are denoted by the same reference numeral.

The field-effect transistor 200 according to the second exemplary embodiment is substantially identical to the field-effect transistor 100 according to the first exemplary embodiment.

Therefore, the fabrication processes and the selected dimensions for fabrication of the field-effect transistor 200 are also identical to those of the field-effect transistor 100 as described in connection with the first exemplary embodiment.

The field-effect transistor 200 in accordance with the second exemplary embodiment differs from the field-effect transistor 100 in accordance with the first exemplary embodiment in particular in that a further gate electrode 201 is provided in the substrate 101as the gate region, referred to below as the second gate electrode 201.

The first gate electrode 109 is electrically coupled to the second gate electrode 201, which is arranged beneath the channel region 104 and is at a distance of from 1 nm to 50 nm, as diagrammatically indicated by an arrow 203 in FIG. 2, from a lower surface 202 of the channel region 104.

This means that, when the first gate electrode 109 is energised, i.e. When an electric potential is applied to the first gate electrode 109, a corresponding electric potential is also applied to the second gate electrode 201.

Evidently, therefore, the first gate electrode 109 and the second gate electrode 201 form what is known as a dual gate arrangement in the field-effect transistor 200.

According to this exemplary embodiment, the second gate electrode 201 is embedded in the substrate 101using a dual damascene process.

This means that the structure for the second gate electrode 201 is etched into the substrate 101, and then the metal from which the second gate electrode 201 is to be formed is deposited in such a manner that the structure which is etched for the second gate electrode 201 is at least completely filled with the deposited metal. Any metal which protrudes above the structure is removed by means of a chemical mechanical polishing process (CMP process). This is followed, once again, by suitable deposition of the desired oxide.

FIG. 3 shows a field-effect transistor 300 according to a third exemplary embodiment of the invention.

The field-effect transistor 300 according to the third exemplary embodiment substantially corresponds to the field-effect transistor 100 according to the first exemplary embodiment.

Identical components of the field-effect transistor 300 according to the third exemplary embodiment are provided with the same reference numerals as the corresponding components of the field-effect transistor 100 according to the first exemplary embodiment.

The field-effect transistor 300 according to the third exemplary embodiment differs from the field-effect transistor 100 according to the first exemplary embodiment in particular in that an electrically insulating layer 301 with a high dielectric constant, i.e. With a dielectric constant in the range from 1 to 1000, or a ferroelectric layer 301 is applied to the metal layer 104.

The layer 301 is applied to the entire surface above the channel region by means of a CVD process, a sputtering process or a physical vapour deposition process.

The layer 301 is fabricated, for example, from BST or SBT.

The thickness of the layer 301, which is diagrammatically indicated by a double arrow 302 in FIG. 3, is from 1 nm to 50 nm according to the third exemplary embodiment.

The first gate electrode 109 is applied to the layer 301.

In a final step, an insulating separating layer 107 is applied, as in the previous exemplary embodiments, to the element which results from the preceding steps.

According to a fourth exemplary embodiment, a second gate electrode (not shown) is also provided for the arrangement according to the third exemplary embodiment, second gate electrode being electrically coupled to the first gate electrode 109.

The following publications are cited in this document:

[1] R. Muller, Bauelemente der Halbleiteretektronik [Components used in Semiconductor Electronics], Springer Verlag, first edition, ISBN 3-540-06224-6, PP. 130–157, 1973;

[2] E. S. Snow et al., A metal/oxide tunnelling transistor, Applied Physics Letters, Vol. 72, No. 23, PP. 3071–3073, Jun. 1998;

[3] G. Martinez-Arizala et al., Coulomb-glass-like behaviour of ultrathin films of metals, Physical Review B, Vol. 57, No. 2, PP. 670–672, Jan. 1998;

[4] Z. Ovadyahu and M. Pollak, Disorder and Magnetic field Dependence of Slow Electronic Relaxation, Physical Review Letters, Vol. 79, No. 3, PP. 459–462, Jul. 1997.

What is claimed is:

1. Field-effect transistor comprising:
   an electrically nonconductive substrate;
   a drain region;
   a source region, having channel region between the drain region and the source region;
   having a gate region by means of which the channel region can be controlled; and
   the channel region being formed by a metal layer which is adapted such that the metal layer, on account of a field-effect which occurs with the layer, can be controlled by means of the gate region.

2. Field-effect transistor according to claim 1, having a second gate region, by means of which the channel region can be controlled.

3. Field-effect transistor according to claim 1 in which the metal layer has one or more layers of metal atoms.

4. Field-effect transistor according to claim 1 in which the metal layer contains at least one of the following metal selected from the group consisting of platinum, gold, silver, titanium, tantalum, palladium, bismuth, indium, chromium, vanadium manganese, iron, cobalt, nickel, yttrium, zirconium, niobium, molybdenum technetium, hafnium and tungsten.

5. Field-effect transistor according to claim 1 in which the separating layer is an electrically insulating layer.

6. Field-effect transistor according to claim 1 in which the separating layer is a layer with a high dislectic constant.

7. Field-effect transistor according to claim 1 in which the separating layer is a ferroelectric layer.

8. Field-effect transistor according to claim 1 in which the drain region and the source region and the gate region include metal.

9. Process for fabricating a field-effect transistor, the process comprising:
   forming a drain region and a source region on a substrate;
   applying a metal layer which form a channel region to the substrate between the drain region and the source region;
   applying a separating layer to the metal layer end between the drain region and the source region; and
   forming a gate region on the separating layer, the gate region being separated from the drain region, the source region and the channel region by the separating layer, in such a manner that the channel region can be controlled by means of the gate region, wherein the channel region formed by the metal layer is adapted such that the metal layer, on account of a field-effect which occurs with the metal layer, can be controlled by means of the gate region.

10. Field-effect transistor according to claim 1 wherein the metal layer contains an alloy of at least two of the metals selected from the group consisting of platinum, gold, silver, titanium, tantalum, palladium, bismuth, indium, chromium, vanadium, manganese, iron, cobalt, nickel, yttrium, zirconium, niobium, molybdenum, technetium, hafnium, and tungsten.

11. Field-effect transistor according to any of claims 1 to 4, having a separating layer applied to the metal layer and between the drain region and the source region.

* * * * *

UNITED STATES PATENT AND TRADEMARK OFFICE
CERTIFICATE OF CORRECTION

PATENT NO.     : 6,809,379 B2
DATED          : October 26, 2004
INVENTOR(S)    : Franz Kreupl It is certified that error appears in the above-identified patent and that said Letters Patent is hereby corrected as shown below:

Title page,
Item [56], References Cited, OTHER PUBLICATIONS, "Z. Ovadyahu" reference, please replace "Poltak" with -- Pollak --;
"Martinez-Arizala G., et al." reference, please replace "Ultrathing" with -- Ultrathin --.

Column 1,
Line 58, please replace "A" with -- a --.

Column 2,
Line 46, please replace "bismuth" with -- bizmuth --;
Line 59, please replace the first word "The" with -- the --;
Line 66, please replace "Electrodes" with -- electrodes --.

Column 3,
Line 53, please replace "102serves" with -- 102 serves --.

Column 4,
Line 4, please replace "i.e. The" with -- i.e. the --;
Line 12, please replace "i.e. From" with -- i.e. from --;
Line 46, please replace "101as" with -- 101 as --;
Line 55, please replace "When" with -- when --;
Line 62, please replace "101using" with -- 101 using --.

Column 5,
Line 21, please replace "With" with -- with --;
Line 40, after "embodiment," and before "second", please insert -- this --.

UNITED STATES PATENT AND TRADEMARK OFFICE
CERTIFICATE OF CORRECTION

PATENT NO. : 6,809,379 B2
DATED : October 26, 2004
INVENTOR(S) : Franz Kreupl

It is certified that error appears in the above-identified patent and that said Letters Patent is hereby corrected as shown below:

Column 6,
Line 2, after "having", please insert -- a --;
Line 8, after "with the", please insert -- metal --;
Line 16, after "following" please replace "metal" with -- metals --;
Line 25, please replace "dislectic" with -- dialectic --;
Line 34, please replace "form" with -- forms --;
Line 37, please replace "end" with -- and --.

Signed and Sealed this

Seventh Day of June, 2005

JON W. DUDAS
*Director of the United States Patent and Trademark Office*